RIGHT ANGLE PRINTED CIRCUIT BOARD CONNECTOR

Filed March 25, 1968

Inventor
Bruno Baumanis
By: Olson, Trexler, Wolters & Bushnell Attys

United States Patent Office 3,555,493
Patented Jan. 12, 1971

3,555,493

RIGHT ANGLE PRINTED CIRCUIT BOARD CONNECTOR

Bruno Baumanis, River Forest, Ill., assignor to Molex Products Company, Downers Grove, Ill., a corporation of Illinois Filed Mar. 25, 1968, Ser. No. 715,720
Int. Cl. H01r *13/50*
U.S. Cl. 339—176 12 Claims

ABSTRACT OF THE DISCLOSURE

A right angle, edge-type printed circuit board connector including a housing having a first wall with a plurality of spaced-apart apertures therein and a second wall at right angles to said first wall having an elongated opening therein which communicates with the spaced-apart apertures within said housing. A plurality of snap-in terminal members is provided, certain ones thereof to be inserted into predetermined ones of the spaced-apart apertures. Each of the terminal members includes a bowed, slotted contact strip. A printed circuit board is inserted into the elongated opening whereby certain ones of the printed conductors of the board make contact with the contact strips of terminal members placed in correspondingly located ones of the spaced-apart apertures.

BACKGROUND OF THE INVENTION

This invention relates generally to connectors for printed circuit boards and more particularly to edge type printed circuit board connectors.

Edge-type printed circuit board connectors are often required to be used in locations where the printed circuit boards and the connector terminal wires are to be on the same side of a chassis or mounting panel. With an ordinary edge-type connector where the wiring and printed circuit board are in substantially the same plane and extend from opposite sides thereof, if the wiring is required at an angle thereto it must be bent accordingly. This causes unnecessary strain on the connections and possible breakage of the wires. Furthermore, more wire is required to make the bend or turn and consequently costs are increased.

SUMMARY OF THE INVENTION

A printed circuit board connector comprising a molded plastic housing and a plurality of identical right angle connectors. The housing is provided with a transverse slot for receipt of a printed circuit board, and the terminals are received in slots at right angles thereto. The terminals preferably have crimp type connections and are assembled with lead wires before insertion, being provided with resilient lances or protrusions for snapping behind complementary shoulders in the housing. Each terminal includes a contact arm and a spaced, stabilizing arm. The contact arm is coplanar with most of the remainder of the terminal, and a contact thereof is bent at right angles from the plane of the arm, etc. to provide a surface engagement with printed wiring on a printed circuit board.

Accordingly, it is an important object of this invention to provide an improved printed circuit board connector in which a printed circuit board may be connected at an angle to the terminal wiring thereof without encountering the above-mentioned difficulties so that the printed circuit board and lead-in wires to the connector may be easily located on the same side of a mounting panel or chassis.

It is yet another object of this invention to provide an improved printed circuit board connector wherein a printed circuit board connected thereto and the terminal wires thereof are normally at right angles to each other and wherein individual terminals may be inserted in predetermined locations in the connector to contact certain ones of the printed conductors of the printed circuit board.

DESCRIPTION OF THE DRAWINGS

A better understanding of the present invention and its organization and construction may be had by referring to the description below in conjunction with the accompanying drawings, wherein.

DETAILED DESCRIPTION

Figures 1, 2, 3, 4, 5:
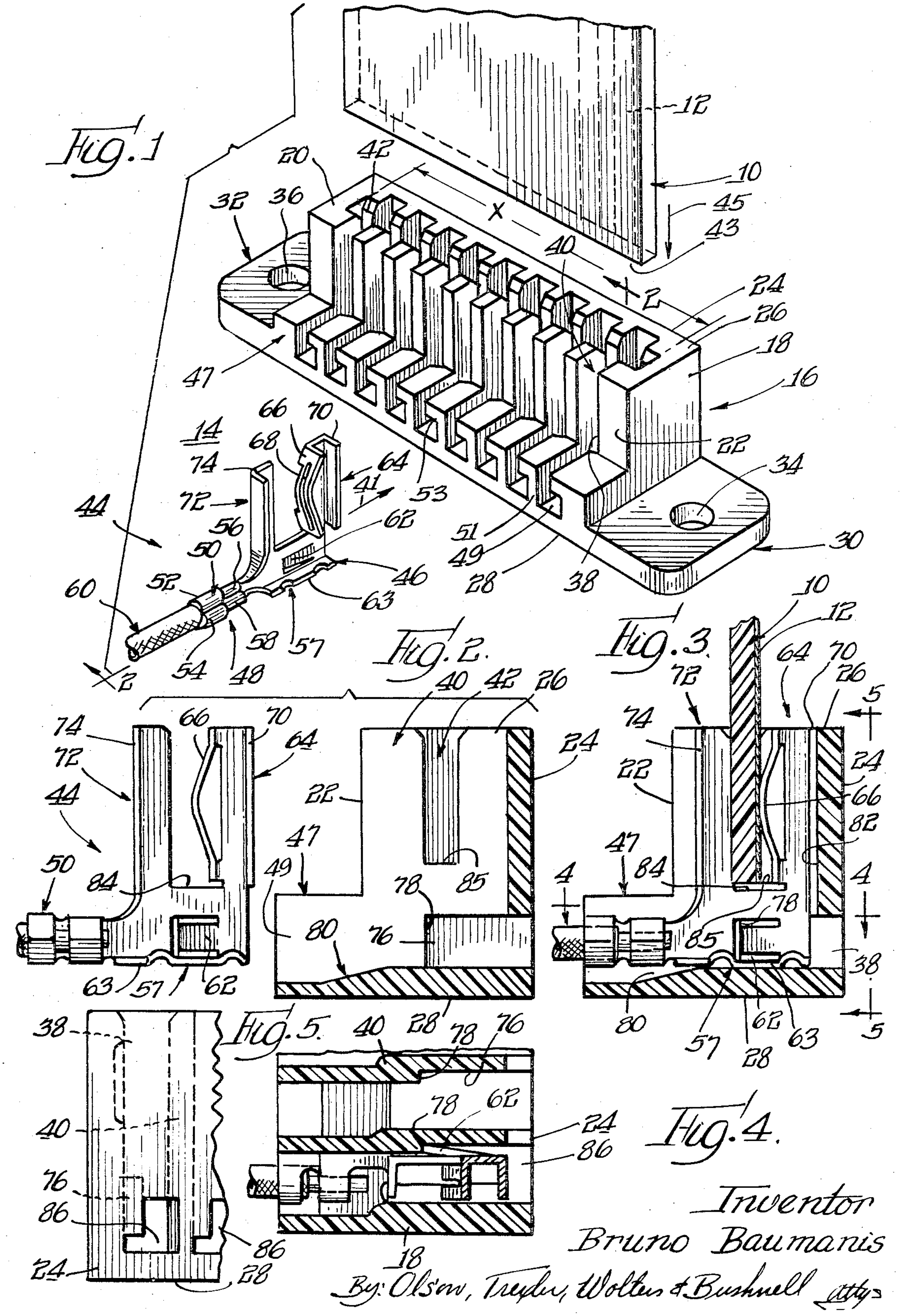
FIG. 1 is an exploded perspective view of a printed circuit board and printed circuit board connector according to the invention.
FIG. 2 is a cross-sectional view of the printed circuit board connector of FIG. 1 taken along the line 2—2 thereof.
FIG. 3 is a side-sectional view of the printed circuit board and connector according to the invention as they appear in an interconnected condition.
FIG. 4 is a horizontal cross-sectional view of the printed circuit connector of FIG. 3 taken along the line 4—4 thereof.
FIG. 5 is a rear elevation of the printed circuit board connector of FIG. 3 taken along the line 5—5 thereof

Referring now to the drawings in more detail and first to FIG. 1, a printed circuit board 10 has the usual copper strip conductors 12 printed thereon, and a printed circuit board connector 14 according to the invention, includes a housing 16 having a rectangular shape and preferably of a one-piece molded nylon construction. The housing 16 includes a pair of end walls 18 and 20, a first pair of opposing side walls 22 and 24 and a second pair of opposing side walls 26 and 28, here shown as the top and base walls, respectively, interconnected with the first pair of side walls as shown in the figure. A pair of tabs or mounting flanges 30 and 32 integrally formed with and extending from the ends of the housing 16, as shown in FIG. 1, may be provided so that the connector 14 can be mounted on a panel or chassis by means of screws or rivets (not shown) inserted into apertures 34 and 36, respectively. A plurality of parallel spaced-apart apertures 38 is located in side wall 22, and each of the apertures extends therefrom through housing 16 to the opposing side wall 24 thereof, as indicated in FIG. 3. A plurality of inner divider walls 40 serve to separate the apertures 38 from each other.

An elongated opening 42 is provided in side wall 26 for receiving therein printed circuit board 10; edge 43 being inserted thereinto in the direction of the arrow 45. The elongated opening 42 indicated by the symbol X, is longer than the combined widths of the spaced apertures 38 and extends substantially at right angles thereto. The elongated opening 42 has been formed as described to allow for ease and accuracy in the insertion of the printed circuit board therein. As can be seen in FIG. 1, elongated opening 42 communicates with each and every one of the apertures 38 within the housing and, as shown in FIG. 2, extends and cuts through divider walls 40.

A plurality of terminals, such as 44 shown in FIG. 1, is provided to be inserted into predetermined ones of the apertures 38 in housing 16 in the direction indicated by the arrow 41, so as to be able to mate with corresponding conductor strips 12 of printed circuit board 10 upon the edgewise insertion of the board into elongated opening 42 of the housing. Each of the terminals is preferably of a one-piece stamped metal construction and includes a leading end 46 and a trailing end 48. The trailing end 48 includes a connector 50, here shown as a crimp type having two pairs of opposing arms 52 and 54, and 56 and 58, respectively, for securing a lead-in wire 60 both in a mechanical and electrical sense, to the terminal; arms 52 and 54 mechanically gripping the lead-in wire at the insulated cover thereof, and arms 56 and 58 securing the conductor both mechanically and electrically.

As will be noted in FIG. 1, an extension 47 of the housing 16 protrudes outwardly from side wall 22 thereof and includes therein a plurality of spaced-apart apertures 49 which are aligned with apertures 38 in housing 16. The extension 47 has been provided so that upon the insertion of terminals 44 into housing 16, the connectors at the trailing ends thereof will be well insulated to prevent short circuiting. As can be seen in FIG. 1, the apertures 49, like apertures 38, are separated by divider walls 51 which are extensions of divider walls 40 to insure an all around insulation of the connectors 50. In addition, covers 3 extending from divider walls 51 partially into apertures 49, and at substantially right angles thereto, are provided further to insulate and protect connectors 50 once the terminals 44 are inserted into the housing.

The leading end 46 of each of the terminals 44 is U-shaped and includes at the base 57 of the U a struck-out resilient tab 62 which, as will be explained in more detail hereinafter, serves to lock each terminal into one of the apertures 38, and a right-angle foot 63 upon which the terminal rests within the housing. A first upstanding leg 64 of the U-shaped leading end 46 includes a right-angle bowed contact strip 66 having a centrally located, elongated slot 68 therein which serves to form two half strips connected at either end thereof. Hence, dirt holding one half strip out of good contact does not affect the other half strip and yet the resiliency and strength of the contact is not lost. The contact strip, as can be seen in FIG. 1, faces inwardly toward the center of the U. Integrally formed with and located adjacent the contact strip at the extreme leading end of the terminal is a protective stop plate or flange 70, the purpose of which will be described hereinafter. The other upstanding leg 72 of the U-shaped leading end 46 includes an L-shaped protective plate or flange 74.

Referring to FIGS. 2–5 of the drawings, a more complete explanation of the terminals 44 and housing 16 and the manner in which the terminals are received in the housing will now be given.

Near the base of each of the apertures 38 in housing 16, at the lower portion of the divider walls 40 separating the apertures 38, is an indentation 76, seen best in FIG. 4. The indentation 76 provides a shoulder 78 in the wall of the housing with which tab 62 of the terminal 44 mates upon the insertion of the latter into a respective aperture 38. Referring to FIG. 4, the tab 62 can readily be seen abutting the shoulder 78. This prevents the unauthorized removal of the terminal 44 from housing 16. It will also be noted that the inner surface 80 of wall 28 extends downwardly within the extension 47 of the housing; thus as shown in FIG. 3, when the terminal 44 is inserted into the housing through an aperture 38, the crimped connector 50 does not touch the floor of the housing; i.e., the inner surface 80 of wall 28. The foot 63 provides support for the terminal and consequently prevents any unnecessary stress on the conductor 50 which might, if damaged, break the connection to the lead-in wires.

As will be noted in FIG. 3, the inner surface 82 of side wall 24 provides a backing or stop for the terminal. Upon the insertion of the terminal in an aperture 38 the stop plate 70 of the first leg 64 of the U-shaped leading end is butted against the inner surface 82 of side wall 24 to position the terminal 44 therein so that the contact strip 66 is aligned with elongated opening 42. The L-shaped protective plate 74 of leg 72 of the leading end of the terminal provides a protective covering for the contact strip 66 so that foreign objects do not become entangled with or settle on the bowed contact strip 66, prior to the insertion of terminal 44 into the housing and afterwards, as well.

Referring now specifically to FIG. 3 of the drawings, the printed circuit board 10 can be seen inserted into aperture 42 so that one of the printed conductors 12 located on the board 10 contacts a respective contact strip 66 of the terminal 44. It should be noted that the board 10 is inserted between the legs 64 and 72 of the U-shaped leading end of the terminal, and the lead-in wires connected to the trailing end of the terminals are at substantially right angles to the printed circuit board. The upwardly facing edge 84 of the base 57 of the U of the leading end of the terminal, it will be noted, extends below the edges 85 of elongated opening 42 formed in divider walls 40, so that edges 85 provide stops which prevent board 10 from being inserted too far into the housing 16. With edges 84 being beneath the edges 85 of the divider all, no damage to the terminals results if the board 10 is inserted into the aperture 42 with excessive force. Because the contact strip 66 is of a bowed resilient metal construction, it flexes upon the insertion of board 10 into housing 16. The appearance of the contact strip 66 before and after the insertion of the board may be noted in FIGS. 2 and 3, respectively. Upon the insertion of board 10 into opening 42, the conductor strips 12 of the printed circuit board mate with a wiping action with respective contact strips of respective terminals and sufficient force is provided to cause reliable contact pressure and an effective electrical connection therebetween.

Referring now to FIG. 5 of the drawings, there is shown therein a view of the housing 16 from the side wall 24 thereof. As will be noted, each of the apertures 38 is joined by an aperture 86 which extends through side wall 24 of the housing. Each of these apertures 86 provides access to a tab 62 which engages shoulder 78 within the housing, so that, if it becomes necessary to remove a respective terminal 44, a small tool (not shown) may be inserted into aperture 86 to release tab 62 from the shoulder 78 while terminal 44 is withdrawn from aperture 38. The manner in which this may be accomplished can easily be visualized by referring to FIG. 4 of the drawings.

Thus, the printed circuit board connector according to the invention is one which is dependable, efficient and of simple construction, and especially useful in situations wherein the lead-in wires to the terminal members and printed circuit boards must be on the same side of a mounting panel or chasiss, or when it is required that the boards and lead-in wires to the terminals of the connector be at an offset angle to one another.

It will be obvious to those skilled in the art that changes and modifications may be made without departing from this invention in its broadest aspects, and therefore the aim in the appended claims is to cover all such changes and modifications as come within the true spirit and scope of the invention.

What is claimed is:

1. A connector for use with a printed circuit board having a plurality of printed conductors thereon, said connector comprising; a housing portion including a first side wall having therein a plurality of spaced-apart apertures and a second side wall at a predetermined angle with said first side wall adn including therein an opening communicating with said plurality of spaced-apart apertures within said housing portion, said opening being adapted to receive therein a printed circuit board with the printed conductors thereof in alignment with corresponding ones of said spaced-apart apertures, and a plurality of terminal members inserted into predetermined ones of said spaced-apart apertures, each of said terminal members having a leading and a trailing end portion, the leading end portion thereof including a leg portion extending outwardly therefrom, said leg portion including contact means and the trailing end portion of said terminal member comprising connector means for connecting said terminal member to an external lead-in wire, said terminal member further including snap-in means securing said terminal member in said apertures with the contact means of said respective terminal member extending into said opening in said second side wall, whereby upon the insertion of a printed circuit board into the last mentioned opening, said contact means may make contact with a corresponding printed circuit conductor of said printed circuit board, said contact means including a bowed contact strip having an elongated slot therein to form two contact portions connected to each other at both ends thereof, wherein said leading end portion of each of said terminal members is U-shaped and said leg portion comprises a first one of the legs of said U, with the bowed surface of said contact strip facing inwardly toward the center of the U, wherein the other leg of the U-shaped leading end portion includes means for preventing engagement of said contact strip by foreign objects, and wherein said opening in said second side wall extends between the U-shaped legs of said terminal members received in corresponding ones of said spaced-apart apertures.

2. A connector as claimed in claim 3 wherein said housing portion further includes, extending from said side wall at said predetermined angle with said second wall, an extension portion for insulating the trailing end portions of said terminal members, said extension portion including a plurality of spaced-apart openings correspondingly aligned with said spaced-apart apertures so that upon the receipt in said spaced-apart apertures of the leading end portions of said terminal members, said spaced-apart openings receive therein corresponding trailing end portions thereof.

3. A connector as claimed in claim 1 wherein said spaced-apart apertures are separated by divider walls, each of the walls including an indentation in one side thereof, wherein said snap-in means includes a resilient tab member extending from the base portion of the U of each of said terminal members and which upon the insertion of the leading end portion of said terminal member into a respective one of said apertures, engages said divider wall at said indentation to secure said terminal member therein, and wherein said base portion further includes foot means for supporting said terminal member within said housing.

4. A connector as claimed in claim 3 wherein said first and second side walls of said housing portion are at substantially a 90 degree angle to each other.

5. A connector for use with a printed circuit board having a plurality of printed conductors thereon, said connector comprising; a one-piece molded, rectangularly-shaped housing portion of insulating material having a first pair of opposing side walls, a second pair of opposing side walls interconnecting said first pair of side walls and a pair of opposing end walls connected to said first and second pair of side walls, a first one of said first pair of side walls including therein a plurality of spaced-apart apertures, a first one of said second pair of side walls including therein an elongated opening extending substantially the length of said side wall and communicating with said spaced-apart apertures within said housing portion, said elongated opening being of a sufficient size to receive therein said printed circuit board, and a plurality of one-piece, metallic terminal members for insertion into predetermined ones of said spaced-apart apertures, each of said terminal members including a leading and trailing end portion, the leading end portion thereof being U-shaped, a first leg of said U including a bowed contact strip facing inwardly toward the center of the U, said contact strip having an elongated slot therein to form twin contact portions which are connected to each other at both ends thereof and the second leg of the U including means for preventing foreign objects from becoming entangled with said contact strip, the base portion of the U-shaped leading end portion of said terminal member including means for snapping said terminal member into a corresponding predetermined one of said spaced-apart apertures, and said trailing end portion of each of said terminal members including connection means for connecting said terminal member to an external lead-in wire, whereby upon the insertion of the leading end portion of said terminal member is predetermined ones of said apertures, the legs of said U extend in the direction of the first one of said second walls on opposite sides of said elongated opening so that upon the insertion of said printed circuit board into said elongated opening, respective ones of said printed conductors thereon are both mechanically and electrically connected to corresponding ones of said contact strips of said terminal members.

6. A connector as claimed in claim 5 wherein said housing portion further includes, integrally formed therewith, an extension portion extending outwardly from said first one of said first pair of side walls, said extension portion including therein a plurality of spaced-apart openings, said openings being aligned and communicating with said spaced-apart apertures in said first one of said first pair of side walls, each of said openings for receiving therein a respective one of the trailing end portions of said terminal members, whereby said connection means of said trailing end portions are insulated by said extension portion.

7. A connector as claimed in claim 6 wherein said spaced-apart apertures are separated by divided walls, each of said divider walls including in one side thereof an identation, and wherein said snap-in means of said base portion of the U-shaped leading end portion of each of said terminal members includes a resilent tab member extending therefrom, said tab member, upon the insertion of the leading end portion of said terminal member into a respective one of said spaced-apart apertures, being received in the indentation in said one side of a corresponding divider wall so as to engage said divider wall, thereby to secure said terminal member in the corresponding spaced-apart aperture.

8. A connector as claimed in claim 7 wherein the second wall of said first pair of opposing side walls includes therein a plurality of spaced-apart holes, said holes being aligned with said spaced-apart apertures in said first wall of said first pair of opposing walls, whereby access to said resilient tab member is provided thereby so that respective ones of said tab members are releasable from engagement with said corresponding indentation for removal of said corresponding terminal member.

9. A terminal comprising a substantially flat body, a portion adapted for connection to a lead and at least in part coplanar with said body, an arm coplanar with said body and extending therefrom, a contact on said arm at right angles to the plane of said arm, body and part of said lead connection portion and connected to said arm relatively adjacent opposite ends thereof, and a projection on said body from the plane thereof to retain said terminal in a housing.

10. A terminal as set forth in claim 9 wherein said contact is bowed, being convex away from said arm.

11. A terminal as set forth in claim 10 wherein said contact is split longitudinally.

12. A terminal as set forth in claim 9 and further including a second arm in parallel spaced relation to said first mentioned arm and coplanar therewith.

References Cited

UNITED STATES PATENTS

| | | | |
|---|---|---|---|
| 3,075,167 | 1/1963 | Kinkaid | 339—176 |
| 3,178,674 | 4/1965 | Scheller | 339—217 |
| 3,273,109 | 9/1966 | Moulin | 339—217 |

RICHARD E. MOORE, Primary Examiner

U.S. Cl. X.R.

339—217, 256

UNITED STATES PATENT OFFICE

CERTIFICATE OF CORRECTION

Patent No. 3,555,493 Dated January 12, 1971

Inventor(s) Bruno Baumanis

It is certified that error appears in the above-identified patent and that said Letters Patent are hereby corrected as shown below:

Column 3, line 35, change "covers 3" to --covers 53--;

Column 4, line 5, change "conductor" to --connector--;

Column 4, line 36, change "all" to --wall--;

Column 5, line 6, change "adn" to --and--;

Column 5, line 42, change "claim 3" to --claim 1--;

Column 6, line 26, change "is" to --in--;

Column 6, line 48, change "divided" to --divider--; and

Column 6, line 53, change "resilent" to --resilient--

Signed and sealed this 6th day of July 1971.

(SEAL)
Attest:

EDWARD M.FLETCHER,JR.
Attesting Officer

WILLIAM E. SCHUYLER, JR.
Commissioner of Patents